United States Patent
Jang et al.

(10) Patent No.: US 8,823,431 B2
(45) Date of Patent: Sep. 2, 2014

(54) DELAY CIRCUIT AND SEMICONDUCTOR APPARATUS INCLUDING THE SAME

(71) Applicant: SK hynix Inc., Icheon-si (KR)

(72) Inventors: Jae Min Jang, Icheon-si (KR); Yong Ju Kim, Icheon-si (KR); Dae Han Kwon, Icheon-si (KR); Hae Rang Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/712,625

(22) Filed: Dec. 12, 2012

(65) Prior Publication Data

US 2014/0002154 A1 Jan. 2, 2014

(30) Foreign Application Priority Data

Jun. 27, 2012 (KR) .................. 10-2012-0069386

(51) Int. Cl.
*H03L 7/06* (2006.01)

(52) U.S. Cl.
USPC ............ 327/158; 327/149; 327/153; 327/161

(58) Field of Classification Search
USPC ............... 327/141, 144–163; 331/15–17; 375/373–376
See application file for complete search history.

(56) References Cited

U.S. PATENT DOCUMENTS

| | | | | |
|---|---|---|---|---|
| 6,069,506 A * | 5/2000 | Miller et al. | ................ | 327/156 |
| 6,853,226 B2 * | 2/2005 | Kwak et al. | ................ | 327/159 |
| 6,927,612 B2 * | 8/2005 | Meyer | ................ | 327/156 |
| 6,987,408 B2 * | 1/2006 | Kim | ................ | 327/158 |
| 7,436,230 B2 * | 10/2008 | Kim | ................ | 327/158 |
| 2004/0119512 A1 * | 6/2004 | Lin | ................ | 327/156 |
| 2004/0217788 A1 * | 11/2004 | Kim | ................ | 327/158 |
| 2005/0028019 A1 * | 2/2005 | Kim | ................ | 713/500 |
| 2008/0211553 A1 * | 9/2008 | Kim et al. | ................ | 327/158 |
| 2009/0033392 A1 * | 2/2009 | Kim | ................ | 327/161 |
| 2011/0241742 A1 * | 10/2011 | Kim et al. | ................ | 327/158 |

FOREIGN PATENT DOCUMENTS

KR 1020080074361 A 8/2008
KR 100931026 B1 12/2009

* cited by examiner

*Primary Examiner* — Brandon S Cole
(74) *Attorney, Agent, or Firm* — William Park & Associates Ltd.

(57) ABSTRACT

A delay circuit includes a clock delay line, a command delay line, a delay line control block, and a shared shift register block. The clock delay line delays an input clock and generates a delayed clock. The command delay line delays a command signal and generates a delayed command signal. The delay line control block generates a control signal according to a result of comparing phases of a feedback clock which is generated as the delayed clock is delayed by a modeled delay value and the input clock. The shared shift register block sets delay amounts of the clock delay line and the command delay line to be substantially the same with each other, in response to the control signal.

15 Claims, 4 Drawing Sheets

DELAY CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2012-0069386, filed on Jun. 27, 2012, in the Korean Intellectual Property Office, which is incorporated herein by reference in its entirety.

BACKGROUND

1. Technical Field

The present invention generally relates to a semiconductor apparatus, and more particularly, to a delay circuit which delays a cock and a command signal and a semiconductor apparatus including the same.

2. Related Art

In general, a semiconductor apparatus including a memory performs an operation in synchronization with a clock. Accordingly, in a synchronous type semiconductor apparatus, input data, and output data should be precisely synchronized with an external clock. The semiconductor apparatus receives the external clock, converts the external clock into an internal clock, and uses the converted internal clock. However, as the internal clock is transmitted through a clock buffer and a transmission line, a phase difference occurs between the internal clock and the external clock. Therefore, in order to compensate for the phase difference, the semiconductor apparatus generally includes a phase-locked loop or a delay-locked loop.

Further, the semiconductor apparatus performs an internal data processing operation by synchronizing a command inputted in synchronization with the external clock, with the internal clock. Thus, a domain crossing operation for synchronizing the command synchronized with the internal clock, with the external clock is performed.

FIG. 1 is a block diagram showing the configuration of a conventional semiconductor apparatus 10. In FIG. 1, the semiconductor apparatus 10 includes a clock delay line 11, a first shift register 12, a delay modeling block 40, a phase detection block 30, and a delay line control block 20. The clock delay line 11 receives an input clock CLKI, delays the input clock CLKI by a preset delay value, and generates a delayed clock CLKD. The delay modeling block 40 delays the delayed clock CLKD by a modeled delay value and generates a feedback clock CLKF.

The phase detection block 30 compares the phases of the input clock CLKI and the feedback clock CLKF. The delay line control block 20 generates a control signal CTRL for controlling the first shift register 12, according to a phase comparison result of the phase detection block 30. The first shift register 12 receives the control signal CTRL and may set the delay value of the clock delay line 11.

Also, the semiconductor apparatus 10 further includes a command delay line 51, a second shift register 52, a clock driver 60, and an output enable signal generation block 70. The second shift register 52 sets the delay value of the command delay line 51 in response to the control signal CTRL. The command delay line 51 delays a command signal CMD by a preset delay value and generates a delayed command signal CMDD. The command delay line 51 may have the same configuration as the clock delay line 11. The clock driver 60 receives the delayed clock CLKD and generates a data clock CLKDQS. The output enable signal generation block 70 generates an output enable signal OUTEN according to the delayed clock CLKD, the delayed command signal CMDD and CAS latency information CL.

As can be seen from FIG. 1, the clock delay line 11 and the command delay line 51 have the same configuration and are controlled by the same control signal CTRL. That is to say, the first shift register 12 for setting the delay amount of the clock delay line 11 and the second shift register 52 for setting the delay amount of the command delay line 51 commonly receive the control signal CTRL which is outputted from the delay line control block 20. In this way, in the conventional semiconductor apparatus, a plurality of delay lines with the same delay value respectively have shift registers.

SUMMARY

A semiconductor apparatus in which a plurality of delay lines share a shift register block is described herein.

In an embodiment, a delay circuit includes: a clock delay line configured to delay an input clock and generate a delayed clock; a command delay line configured to delay a command signal and generate a delayed command signal; a delay line control block configured to generate a control signal according to a result of comparing phases of a feedback clock which is generated as the delayed clock is delayed by a modeled delay value and the input clock; and a shared shift register block configured to set delay amounts of the clock delay line and the command delay line to be substantially the same with each other, in response to the control signal.

In an embodiment, a delay circuit includes: a clock delay line configured to delay an input clock in response to delay control signals and generate a delayed clock; a command delay line configured to delay a command signal in response to the delay control signals and generate a delayed command signal; a delay line control block configured to generate a control signal according to a result of comparing phases of a feedback clock which is generated as the delayed clock is delayed by a modeled delay value and the input clock; and a shared shift register block configured to generate the delay control signals in response to the control signal and provide the delay control signals commonly to the clock delay line and the command delay line.

In an embodiment, a semiconductor apparatus includes: a clock delay line configured to delay an input clock and generate a delayed clock; a command delay line configured to delay a command signal and generate a delayed command signal; a delay line control block configured to generate a control signal according to a result of comparing phases of a feedback clock which is generated as the delayed clock is delayed by a modeled delay value and the input clock; a shared shift register block configured to set delay amounts of the clock delay line and the command delay line to be substantially the same with each other, in response to the control signal; and an output enable signal generation block configured to generate an output enable signal for a data output operation, according to the delayed clock, the delayed command signal and CAS latency information.

BRIEF DESCRIPTION OF THE DRAWINGS

Features, aspects, and embodiments are described in conjunction with the attached drawings, in which.

DETAILED DESCRIPTION

Hereinafter, a delay circuit and a semiconductor apparatus including the same according to various embodiments will be described below with reference to the accompanying drawings through the various embodiments.

Figure 1:
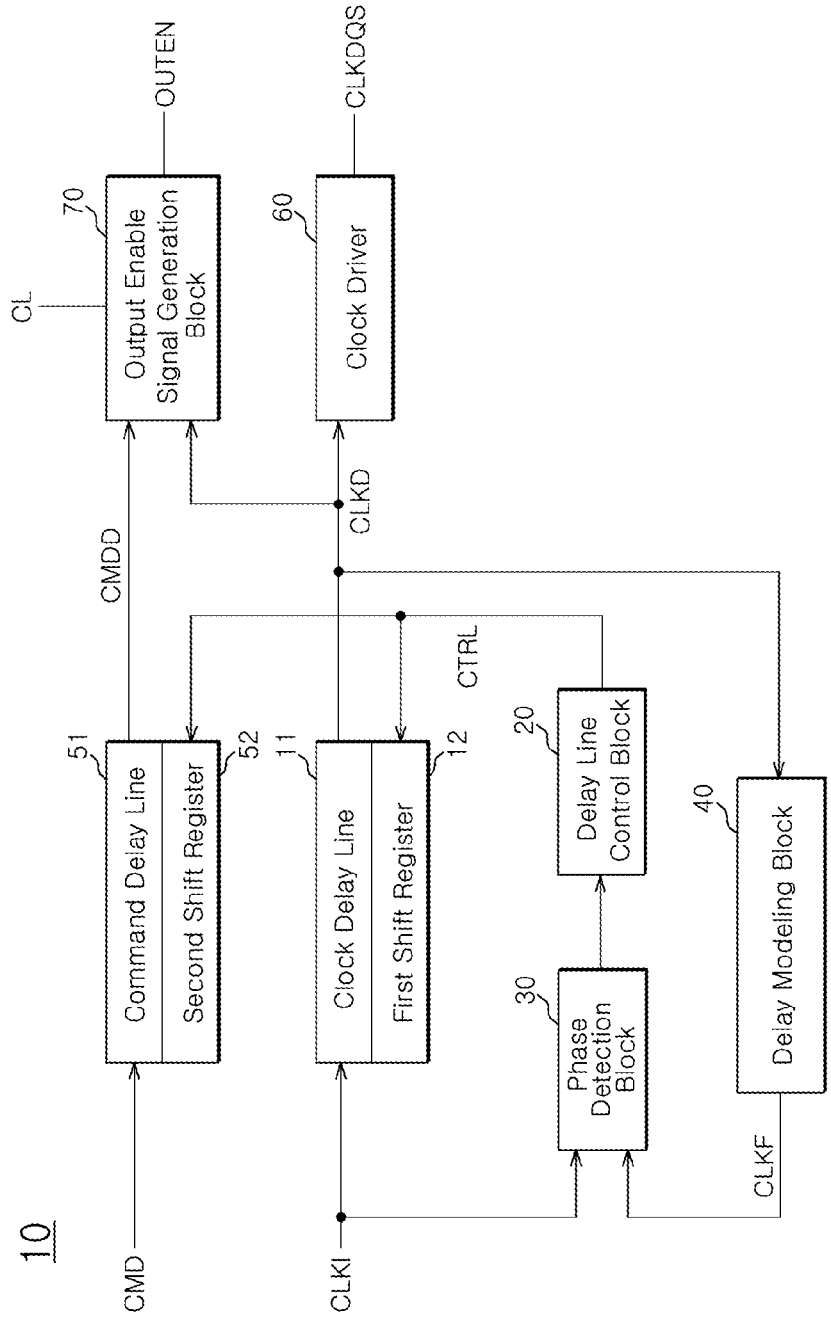
FIG. 1 is a block diagram showing the configuration of a conventional semiconductor apparatus.
Figure 2:
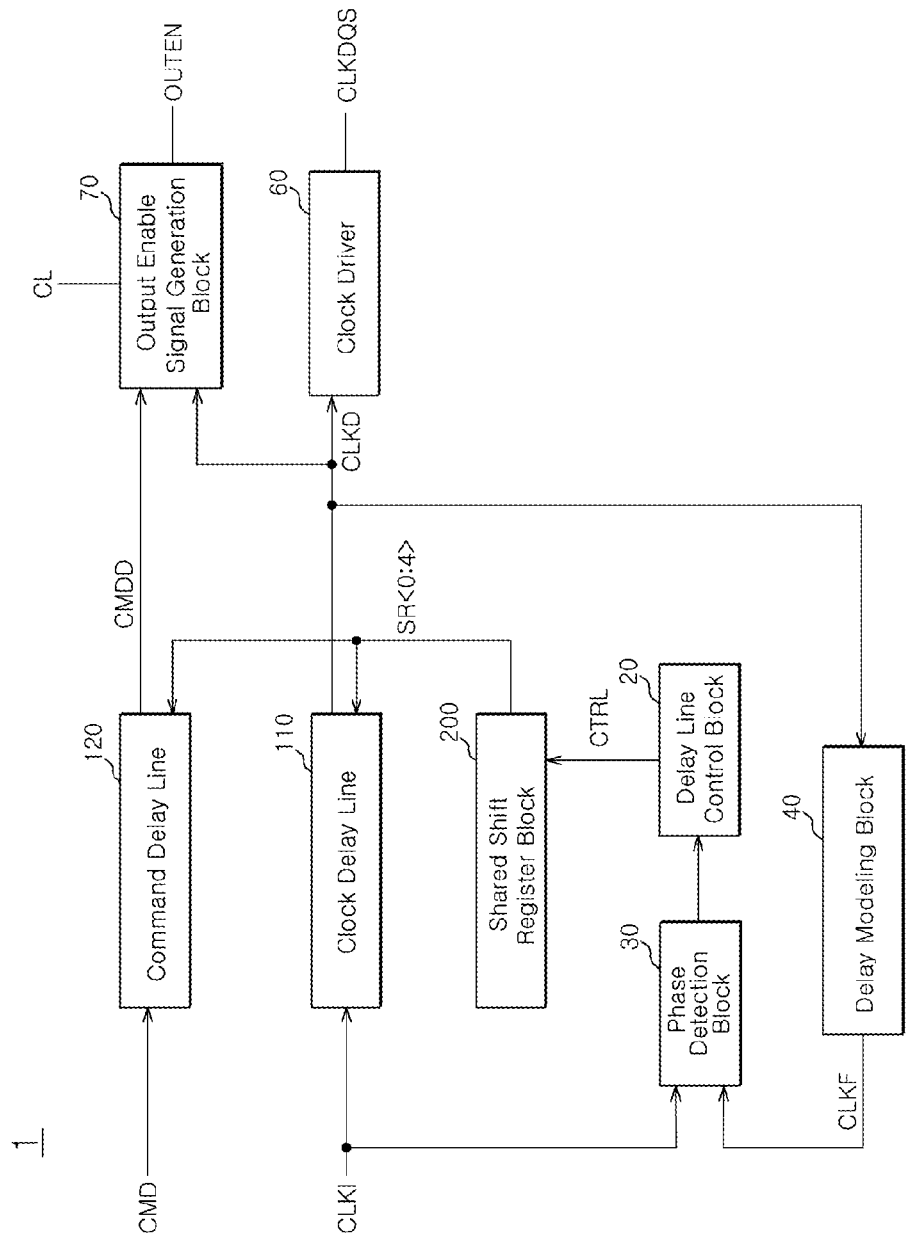
FIG. 2 is a block diagram showing the configuration of a semiconductor apparatus in accordance with an embodiment.

FIG. 2 is a block diagram showing the configuration of a semiconductor apparatus 1 in accordance with an embodiment. In FIG. 2, the semiconductor apparatus 1 may include a clock delay line 110, a command delay line 120, a delay line control block 20, and a shared shift register block 200. The clock delay line 110 may be configured to receive an input clock CLKI, delay the input clock CLKI and generate a delayed clock CLKD. The delay amount of the clock delay line 110 is set according to delay control signals SR<0:4> which are generated by the shared shift register block 200.

The command delay line 120 may be configured to receive a command signal CMD, delay the command signal CMD and generate a delayed command signal CMDD. The delay amount of the command delay line 120 is set according to the delay control signals SR<0:4> which are generated by the shared shift register block 200.

The delay line control block 20 may be configured to generate a control signal CTRL on the basis of a result of comparing the phases of the input clock CLKI and a feedback clock CLKF which may be acquired by delaying the delayed clock CLKD by a modeled value. In other words, the delay line control block 20 may generate the control signal CTRL according to whether the phase of the feedback clock CLKF precedes or follows the phase of the input clock CLKI. For example, in the case where the phase of the feedback clock CLKF is earlier than the phase of the input clock CLKI, the control signal CTRL for decreasing the delay amount of the clock delay line 110 may be generated. Conversely, in the case where the phase of the feedback clock CLKF is later than the phase of the input clock CLKI, the control signal CTRL for increasing the delay amount of the clock delay line 110 may be generated.

The shared shift register block 200 may be configured to set the delay amount of the clock delay line 110 and the command delay line 120. The shared shift register block 200 may generate the delay control signals SR<0:4> to change the delay amount of the clock delay line 110 and the command delay line 120 in response to the control signal CTRL. The shared shift register block 200 is shared by the clock delay line 110 and the command delay line 120. Namely, the shared shift register block 200 provides the delay control signals SR<0:4> commonly to the clock delay line 110 and the command delay line 120. Accordingly, the shared shift register block 200 may set the delay amount of the clock delay line 110 and the delay amount of the command delay line 120 to be substantially the same with each other. In the semiconductor apparatus 1 in accordance with the embodiment, since the shared shift register block 200 is commonly connected with the clock delay line 110 and the command delay line 120, it is possible to control a plurality of delay lines using one shift register block.

The shared shift register block 200 may change the levels of the delay control signals SR<0:4> when the control signal CTRL is enabled, and retains the levels of the delay control signals SR<0:4> when the control signal CTRL is disabled. The shared shift register block 200 may perform a latching operation for retaining the levels of the delay control signals SR<0:4>, and does not perform the latching operation when the levels of the delay control signals SR<0:4> are changed as the control signal CTRL is enabled. The shared shift register block 200 may perform the latching operation in response to the control signal CTRL which is disabled when the level change of the delay control signals SR<0:4> is completed according to the control signal CTRL. The shared shift register block 200 selectively may perform the latch operation according to whether the control signal CTRL is enabled or disabled. Therefore, the shared shift register block 200 may sufficiently drive the delay control signals SR<0:4> which are provided to the clock delay line 110 and the command delay line 120.

In FIG. 2, the semiconductor apparatus 1 may further include a phase detection block 30, a delay modeling block 40, a clock driver 60, and an output enable signal generation block 70. The phase detection block 30 may be configured to compare the phases of the feedback clock CLKF and the input clock CLKI. The phase detection block 30 may provide a result of comparing the phases of the feedback clock CLKF and the input clock CLKI, to the delay line control block 20.

The delay modeling block 40 may have the delay amount acquired by modeling the amount by which the input clock CLKI is delayed in the internal circuit of the semiconductor apparatus 1. The delay modeling block 40 may be configured to delay the delayed clock CLKD by the modeled delay amount, and generate the feedback clock CLKF.

The clock driver 60 may be configured to buffer the delayed clock CLKD and generate a data clock CLKDQS. The data clock CLKDQS is substantially the same clock as the delayed clock CLKD.

The output enable signal generation unit 70 may receive the delayed clock CLKD, the delayed command signal CMDD and CAS latency information CL. The CAS latency information CL has information from after a read command is applied to the semiconductor apparatus 1 to until data is actually outputted from the semiconductor apparatus 1 to an outside. The output enable signal generation block 70 may be configured to generate an output enable signal OUTEN according to the delayed clock CLKD, the delayed command signal CMDD and the CAS latency information CL. The semiconductor apparatus 1 may output data in synchronization with the data clock CLKDQS and the output enable signal OUTEN.

Figure 3:
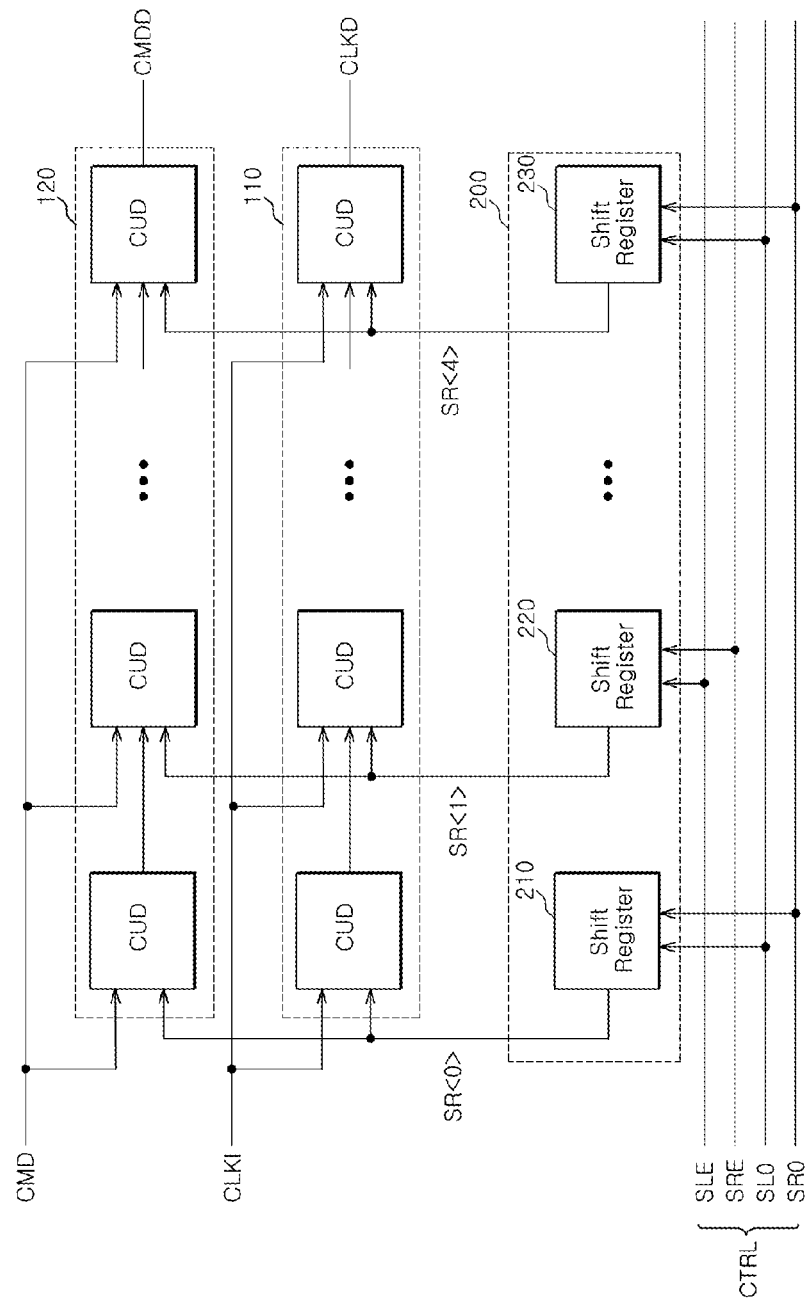
FIG. 3 is a block diagram showing the configurations of various embodiments of the clock delay line, the command delay line and the shared shift register block of FIG. 2.

FIG. 3 is a block diagram showing the configurations of various embodiments of the clock delay line 110, the command delay line 120 and the shared shift register block 200 of FIG. 2. Each of the clock delay line 110 and the command delay line 120 may include a plurality of unit delay cells CUD which are sequentially connected in series. The delay amount of each of the clock delay line 110 and the command delay line 120 may be changed depending upon the number of the unit delay cells CUD enabled among the plurality of unit delay cells CUD. For example, as the number of the enabled unit delay cells CUD increases, the delay amount of each of the clock delay line 110 and the command delay line 120 increases, and, as the number of the enabled unit delay cells CUD decreases, the delay amount of each of the clock delay line 110 and the command delay line 120 decreases. If the number of the enabled unit delay cells CUD increases, since each of the input clock CLKI and the command signal CMD is sequentially delayed starting from a unit delay cell CUD which is disposed at a forward position, it may be delayed more. Conversely, if the number of the enabled unit delay cells CUD decreases, since each of the input clock CLKI and the command signal CMD is sequentially delayed starting from a unit delay cell CUD which is disposed at a backward position, it may be delayed less.

The shared shift register block 200 may enable the unit delay cells CUD which constitute each of the clock delay line 110 and the command delay line 120, by generating the delay control signals SR<0:4>. For example, the shared shift register block 200 may increase or decrease the enable number of the unit delay cells CUD one by one.

In FIG. 3, the shared shift register block 200 may include a plurality of shift registers 210, 220, and 230. The plurality of shift registers 210, 220, and 230 may have substantially the same configuration. Each of the plurality of shift registers 210, 220, and 230 is commonly connected with corresponding unit delay cells CUD of the clock delay line 110 and the command delay line 120. The plurality of shift registers 210, 220, and 230 may generate the delay control signals SR<0:4> capable of determining whether to enable corresponding unit delay cells CUD, in response to the control signal CTRL.

The shift registers 210, 220, and 230 may change the levels of the delay control signals SR<0:4> when the control signal CTRL is enabled, and may retain the levels of the delay control signals SR<0:4> when the control signal CTRL is disabled. The shift registers 210, 220, and 230 may selectively perform the latching operation for the delay control signals SR<0:4> in response to the control signal CTRL. That is to say, the shift registers 210, 220, and 230 are configured not to perform the latching operation when the levels of the delay control signals SR<0:4> are changed as the control signal CTRL is enabled. Because the shift registers 210, 220, and 230 may selectively perform the latching operation according to the control signal CTRL, it is possible to sufficiently drive the delay control signals SR<0:4>. Thus, the shift registers 210, 220, and 230 may be commonly connected with respectively corresponding unit delay cells CUD of the clock delay line 110 and the command delay line 120.

In FIG. 3, the control signal CTRL may include first and second odd control signals SLO and SRO and first and second even control signals SLE and SRE. The plurality of shift registers 210, 220, and 230 alternately receive the first and second odd control signals SLO and SRO and the first and second even control signals SLE and SRE. In other words, the first and third shift registers 210 and 230 receive the first and second odd control signals SLO and SRO, and the second shift register 220 receives the first and second even control signals SLE and SRE. The reason why the plurality of shift registers 210, 220, and 230 alternately receive the control signal CTRL is to sequentially change the logic values of the delay control signals SR<0:4> which are generated by the shared shift register block 200.

Figure 4:
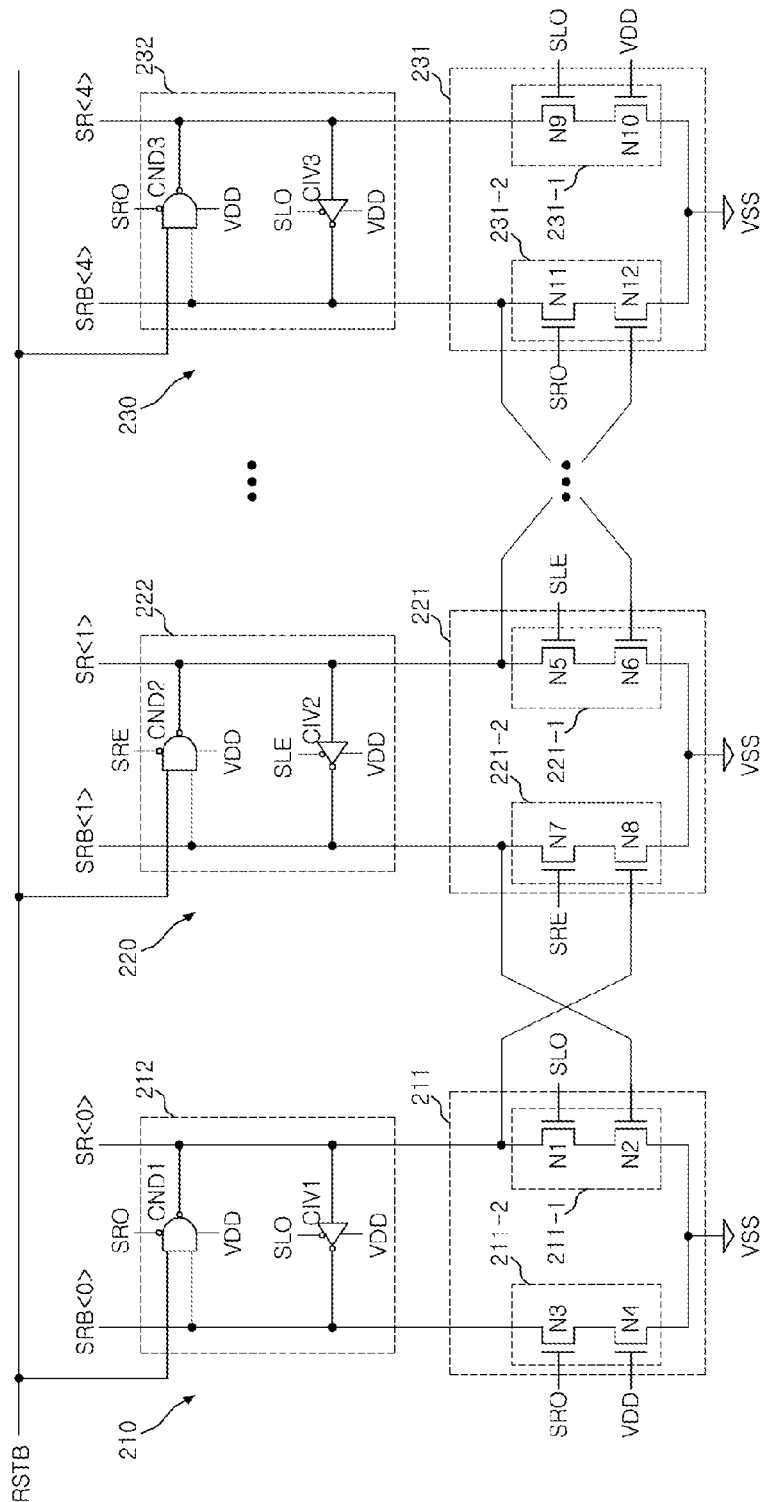
FIG. 4 is a view showing the configuration of an embodiment of the shared shift register block in the semiconductor apparatus in accordance with an embodiment.

FIG. 4 is a view showing the configuration of an embodiment of the shared shift register block 200 in the semiconductor apparatus in accordance with an embodiment. In FIG. 4, the first shift register 210 may include a first sink driver 211 and a first control latch section 212. The first sink driver 211 receives the first and second odd control signals SLO and SRO, and may change the levels of the delay control signal SR<0> and the inverted signal SRB<0> of the delay control signal SR<0>.

The first control latch section 212 selectively may perform the function of a driver and the function of a latch in response to the first and second odd control signals SLO and SRO. The first control latch section 212 may change the levels of the delay control signal SR<0> and the inverted signal SRB<0> of the delay control signal SR<0> when the first and second odd control signals SLO and SRO are enabled, and retains the levels of the delay control signal SR<0> and the inverted signal SRB<0> of the delay control signal SR<0> when the first and second odd control signals SLO and SRO are disabled. Since the first control latch section 212 does not perform the latching operation when the levels of the delay control signal SR<0> and the inverted signal SRB<0> of the delay control signal SR<0> are changed, the levels of the delay control signal SR<0> and the inverted signal SRB<0> of the delay control signal SR<0> may be easily changed.

The first sink driver 211 may include a first sink part 211-1 and a second sink part 211-2. The first sink part 211-1 may include first and second transistors N1 and N2. The first transistor N1 receives the first odd control signal SLO through the gate, and any one of the source and the drain is connected with the delay control signal SR<0>. The second transistor N2 has the gate through which the inverted signal SRB<1> of the delay control signal SR<1> generated by the second shift register 220 is received, the drain which is connected with the other one of the source and the drain of the first transistor N1, and the source which is connected with a ground voltage VSS. Accordingly, the first sink part 211-1 may change the delay control signal SR<0> to a low level in the case where the first odd control signal SLO is enabled and the inverted signal SRB<1> of the delay control signal SR<1> with a high level is received.

The second sink part 211-2 may include third and fourth transistors N3 and N4. The third transistor N3 receives the second odd control signal SRO through the gate, and any one of the source and the drain is connected with the inverted signal SRB<0> of the delay control signal SR<0>. The fourth transistor N4 has the gate through which an external voltage VDD is received, the drain which is connected with the other one of the source and the drain of the third transistor N3, and the source which is connected with the ground voltage VSS. Accordingly, the second sink part 211-2 may change the inverted signal SRB<0> of the delay control signal SR<0> to a low level in the case where the second odd control signal SRO is enabled.

The first control latch section 212 may include a first control NAND gate CND1 and a first control inverter CIV1. Whether the first control NAND gate CND1 is to be operated or not is determined in response to the second odd control signal SRO. The first control NAND gate CND1 may not operate when the second odd control signal SRO is enabled and may operate when the second odd control signal SRO is disabled. The first control NAND gate CND1 may receive a reset signal RSTB and the inverted signal SRB<0> of the delay control signal SR<0> and may generate the delay control signal SR<0>. The reset signal RSTB is a signal which is enabled to a low level. Whether the first control inverter CIV1 is to be operated or not is determined in response to the first odd control signal SLO. The first control inverter CIV1 may not operate when the first odd control signal SLO is enabled and may operate when the first odd control signal SLO is disabled. The first control inverter CIV1 may invert the delay control signal SR<0> and may generate the inverted signal SRB<0> of the delay control signal SR<0>.

The first control latch section 212 may perform the function of a driver in the case where only one of the first and second odd control signals SLO and SRO is enabled. If the first odd control signal SLO is enabled, the first control inverter CIV1 does not operate and the first control NAND gate CND1 operates. Namely, if the first odd control signal SLO is enabled, since the level of the delay control signal SR<0> may be changed, the first control NAND gate CND1 performs the function of a driver which changes the level of the delay control signal SR<0>. Similarly, if the second odd control signal SRO is enabled, the first control NAND gate CND1 does not operate and the first control inverter CIV1 operates. Namely, if the second odd control signal SRO is enabled, since the level of the inverted signal SRB<0> of the delay control signal SR<0> may be changed, the first control inverter CIV1 performs the function of a driver which changes the level of the inverted signal SRB<0> of the delay control signal SR<0>.

If the level change of the delay control signal SR<0> or the inverted signal SRB<0> of the delay control signal SR<0> is completed and the first or second odd control signal SLO or SRO is disabled, both the first control NAND gate CND1 and the first control inverter CIV1 operate. Therefore, the first control NAND gate CND1 and the first control inverter CIV1 may form a latch structure and may retain the levels of the delay control signal SR<0> and the inverted signal SRB<0> of the delay control signal SR<0>.

In FIG. 4, the second shift register 220 may include a second sink driver 221 and a second control latch section 222. The second sink driver 221 receives the first and second even control signals SLE and SRE, and may change the levels of the delay control signal SR<1> and the inverted signal SRB<1> of the delay control signal SR<1>.

The second control latch section 222 selectively may perform the function of a driver and the function of a latch in response to the first and second even control signals SLE and SRE. The second control latch section 222 may change the levels of the delay control signal SR<1> and the inverted signal SRB<1> of the delay control signal SR<1> when the first and second even control signals SLE and SRE are enabled, and may retain the levels of the delay control signal SR<1> and the inverted signal SRB<1> of the delay control signal SR<1> when the first and second even control signals SLE and SRE are disabled. Since the second control latch section 222 does not perform the latching operation when the levels of the delay control signal SR<1> and the inverted signal SRB<1> of the delay control signal SR<1> are changed, the levels of the delay control signal SR<1> and the inverted signal SRB<1> of the delay control signal SR<1> may be easily changed.

The second sink driver 221 may include a third sink part 221-1 and a fourth sink part 221-2. The third sink part 221-1 may include fifth and sixth transistors N5 and N6. The fifth transistor N5 receives the first even control signal SLE through the gate, and any one of the source and the drain is connected with the delay control signal SR<1>. The sixth transistor N6 has the gate through which the inverted signal SRB<2> of the delay control signal SR<2> generated by the shift register positioned at the next stage is received, the drain which is connected with the other one of the source and the drain of the fifth transistor N5, and the source which is connected with the ground voltage VSS. Accordingly, the third sink part 221-1 may change the delay control signal SR<1> to a low level in the case where the first even control signal SLE is enabled and the inverted signal SRB<2> of the delay control signal SR<2> with a high level is received.

The fourth sink part 221-2 may include seventh and eighth transistors N7 and N8. The seventh transistor N7 receives the second even control signal SRE through the gate, and any one of the source and the drain is connected with the inverted signal SRB<1> of the delay control signal SR<1>. The eighth transistor N8 has the gate through which the delay control signal SR<0> generated by the first shift register 210 is received, the drain which is connected with the other one of the source and the drain of the seventh transistor N7, and the source which is connected with the ground voltage VSS. Accordingly, the fourth sink part 221-2 may change the inverted signal SRB<1> of the delay control signal SR<1> to a low level in the case where the second even control signal SRE is enabled and the delay control signal SR<0> with a high level is received.

The second control latch section 222 may include a second control NAND gate CND2 and a second control inverter CIV2. Whether the second control NAND gate CND2 is to be operated or not is determined in response to the second even control signal SRE. The second control NAND gate CND2 may not operate when the second even control signal SRE is enabled and may operate when the second even control signal SRE is disabled. The second control NAND gate CND2 may receive the reset signal RSTB and the inverted signal SRB<1> of the delay control signal SR<1> and may generate the delay control signal SR<1>. Whether the second control inverter CIV2 is to be operated or not is determined in response to the first even control signal SLE. The second control inverter CIV2 may not operate when the first even control signal SLE is enabled and may operate when the first even control signal SLE is disabled. The second control inverter CIV2 may invert the delay control signal SR<1> and may generate the inverted signal SRB<1> of the delay control signal SR<1>.

The second control latch section 222 may perform the function of a driver in the case where only one of the first and second even control signals SLE and SRE is enabled. If the first even control signal SLE is enabled, the second control inverter CIV2 does not operate and the second control NAND gate CND2 operates. Namely, if the first even control signal SLE is enabled, since the level of the delay control signal SR<1> may be changed, the second control NAND gate CND2 performs the function of a driver which changes the level of the delay control signal SR<1>. Similarly, if the second even control signal SRE is enabled, the second control NAND gate CND2 does not operate and the second control inverter CIV2 operates. Namely, if the second even control signal SRE is enabled, since the level of the inverted signal SRB<1> of the delay control signal SR<1> may be changed, the second control inverter CIV2 performs the function of a driver which changes the level of the inverted signal SRB<1> of the delay control signal SR<1>.

If the level change of the delay control signal SR<1> or the inverted signal SRB<1> of the delay control signal SR<1> is completed and the first or second even control signal SLE or SRE is disabled, both the second control NAND gate CND2 and the second control inverter CIV2 operate. Therefore, the second control NAND gate CND2 and the second control inverter CIV2 may form a latch structure and may retain the levels of the delay control signal SR<1> and the inverted signal SRB<1> of the delay control signal SR<1>.

The third shift register 230 may include a third sink driver 231 and a third control latch section 232. The third sink driver 231 may include a fifth sink part 231-1 and a sixth sink part 231-2, and the third control latch section 232 may include a third control NAND gate CND3 and a third control inverter CIV3. The third shift register 230 has the same configuration as the first shift register 210, and may be configured such that a tenth transistor N10 constituting the fifth sink part 231-1 receives the external voltage VDD, instead of receiving the inverted signal of the delay control signal of a next stage. Also, a twelfth transistor N12 constituting the sixth sink part 231-2 receives the delay control signal SR<3> of the shift register of the previous stage through the gate, instead of receiving the external voltage VDD. The unillustrated shift register positioned third receives the first and second odd control signals SLO and SRO and may generate the delay control signal SR<2> and the inverted signal SRB<2> of the delay control signal SR<2>, and the unillustrated shift register positioned fourth receives the first and second even control signals SLE and SRE and may generate the delay control signal SR<3> and the inverted signal SRB<3> of the delay control signal SR<3>.

Hereafter, operations of the shared shift register block 200 in accordance with an embodiment will be described. For example, it is assumed that the shared shift register block 200 may include five shift registers. That is to say, a first register corresponds to the first shift register 210, a second shift register corresponds to the second shift register 220, and a fifth shift register corresponds to the third shift register 230. However, it is to be noted that the number of shift registers may be increased or decreased according to an embodiment. First, the reset signal RSTB is enabled to the low level, the delay control signals SR<0:4> have the levels of 1, and the inverted signals SRB<0:4> of the delay control signals SR<0:4> have the levels of 0. Then, the delay control signals SR<0:4> generated by the shared shift register block 200 are set to 11111. If the first odd control signal SLO is enabled, the sink driver and the control NAND gate of the fifth shift register drive the delay control signal SR<4> to 0. Since the sink drivers of the first shift register and the third shift register respectively receive the inverted signals SRB<1> and SRB<3> of the delay control signals SR<1> and SR<3> of the second shift register and the fourth shift register which have the levels of 0, they cannot drive the delay control signals SR<0> and SR<2> to 0. If the first odd control signal SLO is disabled, the delay control signal SR<4> is retained to the level of 0 by the control latch section, and the inverted signal SRB<4> of the delay control signal SR<4> is retained to the level of 1. Therefore, the delay control signals SR<0:4> may be set to 11110.

Next, if the first even control signal SLE is enabled, the sink driver and the control NAND gate of the fourth shift register drive the delay control signal SR<3> to 0. If the first even control signal SLE is disabled, the delay control signal SR<3> is retained to the level of 0 by the control latch section, and the inverted signal SRB<3> of the delay control signal SR<3> is retained to the level of 1. Therefore, the delay control signals SR<0:4> may be set to 11100.

Thereafter, if the second even control signal SRE is enabled, the sink driver and the control NAND gate of the fourth shift register drive the inverted signal SRB<4> of the delay control signal SR<4> to 0. Since the sink driver of the second shift register receives the level of the delay control signal SR<0> of the first shift register, that is, 1, it drives the inverted signal SRB<1> of the delay control signal SR<1> to 0. If the second even control signal SRE is enabled, the delay control signals SR<0:4> may be set to 11110. As is apparent from the above descriptions, the shared shift register block 200 in accordance with an embodiment may sequentially increase or decrease the logic values of the delay control signals SR<0:4>.

The shared shift register block in accordance with an embodiment does not perform a latching operation but serves as a driver when the levels of the delay control signals are changed, and performs the latching operation when the level change of the delay control signals is completed. Accordingly, even though the shared shift register block is commonly connected with a plurality of delay lines, it is possible to provide a sufficient driving force for changing the levels of the delay control signals.

While the structure of the delay line in which a plurality of unit delay cells are connected in series was exemplarily described above, it is to be noted that the configuration and control scheme of the shared shift register block may be modified and altered in conformity with the structures of various delay lines.

While various embodiments have been described above, it will be understood to those skilled in the art that the embodiments described are by way of example only. Accordingly, the delay circuit and the semiconductor apparatus including the same described herein should not be limited based on the described embodiments.

What is claimed is:

1. A semiconductor apparatus comprising:
   a clock delay line configured to delay an input clock and generate a delayed clock;
   a command delay line configured to delay a command signal and generate a delayed command signal;
   a delay line control block configured to generate a control signal according to a result of comparing phases of a feedback clock which is generated as the delayed clock is delayed by a modeled delay value and the input clock;
   a shared shift register block configured to set delay amounts of the clock delay line and the command delay line to be substantially the same with each other, in response to the control signal;
   a clock driver configured to buffer the delayed clock and generate a data clock; and
   an output enable signal generation unit configured to generate an output enable signal for an data output operation, based on the delayed command signal, the delayed clock and CAS latency information,
   wherein the semiconductor apparatus outputs data in synchronization with the output enable signal and the delayed clock.

2. The semiconductor apparatus according to claim 1, wherein each of the clock delay line and the command delay line comprises a plurality of unit delay cells, and a delay amount of each of the input clock and the command signal is set according to the number of unit delay cells which are enabled among the plurality of unit delay cells.

3. The semiconductor apparatus according to claim 2, wherein the shared shift register block generates delay control signals which control whether to enable the plurality of unit delay cells, in response to the control signal.

4. The semiconductor apparatus according to claim 2, wherein the shared shift register block increases or decreases one by one the number of the enabled unit delay cells in response to the control signal.

5. The semiconductor apparatus according to claim 1,
   wherein the shared shift register block comprises a plurality of shift registers,
   wherein the shift registers generate the delay control signals to set the delay amounts of the clock delay line and the command delay line, in response to the control signal, and
   wherein the shift registers change logic values of the delay control signals when the control signal is enabled and retain logic values of the delay control signals when the control signal is disabled.

6. The semiconductor apparatus according to claim 5, wherein the shift registers comprise:
   sink drivers configured to respectively change levels of the delay control signals in response to the control signal; and
   control latch parts configured to change or retain levels of the delay control signals in response to the control signal.

7. The semiconductor apparatus according to claim 6, wherein the control latch parts do not perform a latching operation when the levels of the delay control signals are changed in response to the control signal.

8. The semiconductor apparatus according to claim 6, wherein the shift registers are connected with respectively corresponding unit delay cells of the clock delay line and the command delay line in common.

9. The semiconductor apparatus according to claim 5, wherein the control signal comprises:
a first odd control signal;
a second odd control signal;
a first even control signal;
a second even control signal; and
wherein the shift registers alternately receive the first and second odd control signals, and the first and second even control signals for sequentially changing the logic values of the delay control signals.

10. A semiconductor apparatus comprising:
a clock delay line configured to delay an input clock in response to delay control signals and generate a delayed clock;
a command delay line configured to delay a command signal in response to the delay control signals and generate a delayed command signal;
a delay line control block configured to generate a control signal according to a result of comparing phases of a feedback clock which is generated as the delayed clock is delayed by a modeled delay value and the input clock;
a shared shift register block configured to generate the delay control signals in response to the control signal and provide the delay control signals commonly to the clock delay line and the command delay line;
a clock driver configured to buffer the delayed clock and generate a data clock; and
an output enable signal generation unit configured to generate an output enable signal for an data output operation, based on the delayed command signal, the delayed clock and CAS latency information,
wherein the semiconductor apparatus outputs data in synchronization with the output enable signal and the delayed clock.

11. The semiconductor apparatus according to claim 10, wherein each of the clock delay line and the command delay line comprises a plurality of unit delay cells, and the delay control signals control the number of unit delay cells which are enabled among the plurality of unit delay cells.

12. The semiconductor apparatus according to claim 11, wherein the shared shift register block increases or decreases one by one the number of the enabled unit delay cells in response to the control signal.

13. The semiconductor apparatus according to claim 10, wherein the shared shift register block comprises a plurality of shift registers, and
wherein the shift registers generate the delay control signals in response to the control signal, and change logic values of the delay control signals when the control signal is enabled and retain logic values of the delay control signals when the control signal is disabled.

14. The semiconductor apparatus according to claim 10, wherein the shared shift register block comprises a plurality of shift registers, and
wherein the shift registers comprise:
sink drivers configured to respectively change levels of the delay control signals in response to the control signal; and
control latch parts configured to change or retain levels of the delay control signals in response to the control signal.

15. The semiconductor apparatus according to claim 14, wherein the control latch parts do not perform a latching operation when the levels of the delay control signals are changed in response to the control signal.

* * * * *